s010644679B2

United States Patent
Takeda

(10) Patent No.: US 10,644,679 B2
(45) Date of Patent: May 5, 2020

(54) LEVEL SHIFT CIRCUIT

(71) Applicant: RENESAS ELECTRONICS CORPORATION, Tokyo (JP)

(72) Inventor: Koichi Takeda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/249,502

(22) Filed: Jan. 16, 2019

(65) Prior Publication Data

US 2019/0260360 A1    Aug. 22, 2019

(30) Foreign Application Priority Data

Feb. 22, 2018    (JP) .................................. 2018-029828

(51) Int. Cl.
| | |
|---|---|
| *H03K 3/00* | (2006.01) |
| *H03K 3/012* | (2006.01) |
| *H03K 19/0185* | (2006.01) |
| *H03K 3/037* | (2006.01) |

(52) U.S. Cl.
CPC ............. *H03K 3/012* (2013.01); *H03K 3/037* (2013.01); *H03K 19/018521* (2013.01)

(58) Field of Classification Search
CPC ....... H03K 19/0013; H03K 19/018521; H03K 19/018528; H03K 19/00315; H03K 3/356113; G11C 8/08; G11C 5/145; G11C 7/12
See application file for complete search history.

(56) References Cited

U.S. PATENT DOCUMENTS

| 6,326,831 | B1 | 12/2001 | Kumagai | |
|---|---|---|---|---|
| 9,350,352 | B2 * | 5/2016 | Koike | H03K 19/018521 |
| 2011/0037509 | A1 * | 2/2011 | Herzer | H03K 19/018521 327/333 |
| 2011/0285449 | A1 * | 11/2011 | Herzer | H03K 19/018521 327/333 |

FOREIGN PATENT DOCUMENTS

| JP | 3635975 B2 | 4/2005 |
|---|---|---|
| JP | 4702261 B2 | 6/2011 |

* cited by examiner

*Primary Examiner* — Long Nguyen
(74) *Attorney, Agent, or Firm* — McDermott Will & Emery LLP

(57) ABSTRACT

A level shift circuit includes a pulse signal generation unit generating first and second pulse signals with respect to an input signal, a first level conversion unit converting the first pulse signal at a first voltage to a third pulse signal at a second voltage, a second level conversion unit converting the second pulse signal at the first voltage to a fourth pulse signal at the second voltage, and a flip flop circuit making an output signal at the second voltage rise according to the third pulse signal, and making the output signal at the second voltage fall according to the fourth pulse signal. The pulse signal generation unit compares the input signal with the output signal of the flip flop circuit, and generates the first pulse signal when the input signal rises and the second pulse signal when the input signal falls, based on a non-matching comparison result.

14 Claims, 14 Drawing Sheets

LEVEL SHIFT CIRCUIT

CROSS-REFERENCE TO RELATED APPLICATIONS

The disclosure of Japanese Patent Application No. 2018-029828 filed on Feb. 22, 2018 including the specification, drawings and abstract is incorporated herein by reference in its entirety.

BACKGROUND

This disclosure relates to a level shift circuit that outputs an output signal at a voltage different from the voltage of an input signal.

As a circuit that on-off drives a semiconductor switching element that configures the upper arm of a bridge circuit for electric power inverse conversion (conversion from a direct current to an alternating current) of a PWM inverter and the like used as a motor driver and the like, a so-called level shift circuit that does not perform potential insulation by a transformer, a photocoupler, and the like has been recently used for cost reduction.

In addition, the level shift circuit has been used in a nonvolatile memory operated at various power supply voltages.

However, when the typical level shift circuit that converts a low voltage signal to a high voltage signal is used for these applications, there are various problems.

For example, when the motor is PWM controlled, a delay difference is caused between the rising time and the falling time of the signal in the typical level shift circuit. Due to this, the pulse width is different between the input and the output, and consequently, there is a problem that precise control is difficult.

In addition, in the typical level shift circuit of the non-volatile memory, there is a problem that the circuit area becomes large to increase the cost.

For coping with the problems, to easily control the pulse width and to reduce the circuit area, a level shift circuit that uses an RS flip flop circuit to convert a low voltage signal to a high voltage signal is proposed (see U.S. Pat. No. 3,635,975).

In addition, a pulse generation circuit that generates a pulse signal inputted to the RS flip flop circuit used for the level shift circuit is proposed (see U.S. Pat. No. 4,702,261).

SUMMARY

On the other hand, in the level shift circuit using the RS flip flop circuit, which is disclosed in U.S. Pat. No. 3,635,975, when the pulse width outputted from the pulse signal generation circuit is too short, the set operation or the reset operation is not enabled in the RS flip flop circuit, and consequently, there is a possibility that the voltage level conversion cannot be correctly performed. In addition, on the contrary, when the pulse width outputted from the pulse signal generation circuit is too long, wasteful electric current consumption is caused.

This is because when the operation conditions (temperature, voltage, and the like) are different, the pulse width of the output signal extends or shrinks with respect to the pulse width of the input signal inputted to the RS flip flop circuit, and consequently, there is a problem that it is difficult to appropriately control the pulse width.

That is, there is a problem that it is difficult for the level shift circuit using the RS flip flop circuit to satisfy the low electric current consumption properties and the high-speed operativity at the same time while stable level conversion is achieved.

This disclosure has been made to solve the above problems, and provides a level shift circuit that enables stable level conversion.

Other problems and novel features will be apparent from the description herein and the accompanying drawings.

A level shift circuit in an aspect of this disclosure includes a pulse signal generation unit, first and second level conversion units, and a flip flop circuit. The pulse signal generation unit generates first and second pulse signals with respect to an input signal. The first level conversion unit converts the first pulse signal at a first voltage to a third pulse signal at a second voltage. The second level conversion unit converts the second pulse signal at the first voltage to a fourth pulse signal at the second voltage. The flip flop circuit makes an output signal at the second voltage rise according to the third pulse signal, and makes the output signal at the second voltage fall according to the fourth pulse signal. When the input signal rises, the pulse signal generation unit compares the input signal with the output signal of the flip flop circuit, and generates the first pulse signal based on a non-matching comparison result. When the input signal falls, the pulse signal generation unit compares the input signal with the output signal of the flip flop circuit, and generates the second pulse signal based on the non-matching comparison result.

According to the one example, the level shift circuit enables stable level conversion.

DETAILED DESCRIPTION

Figure 1:
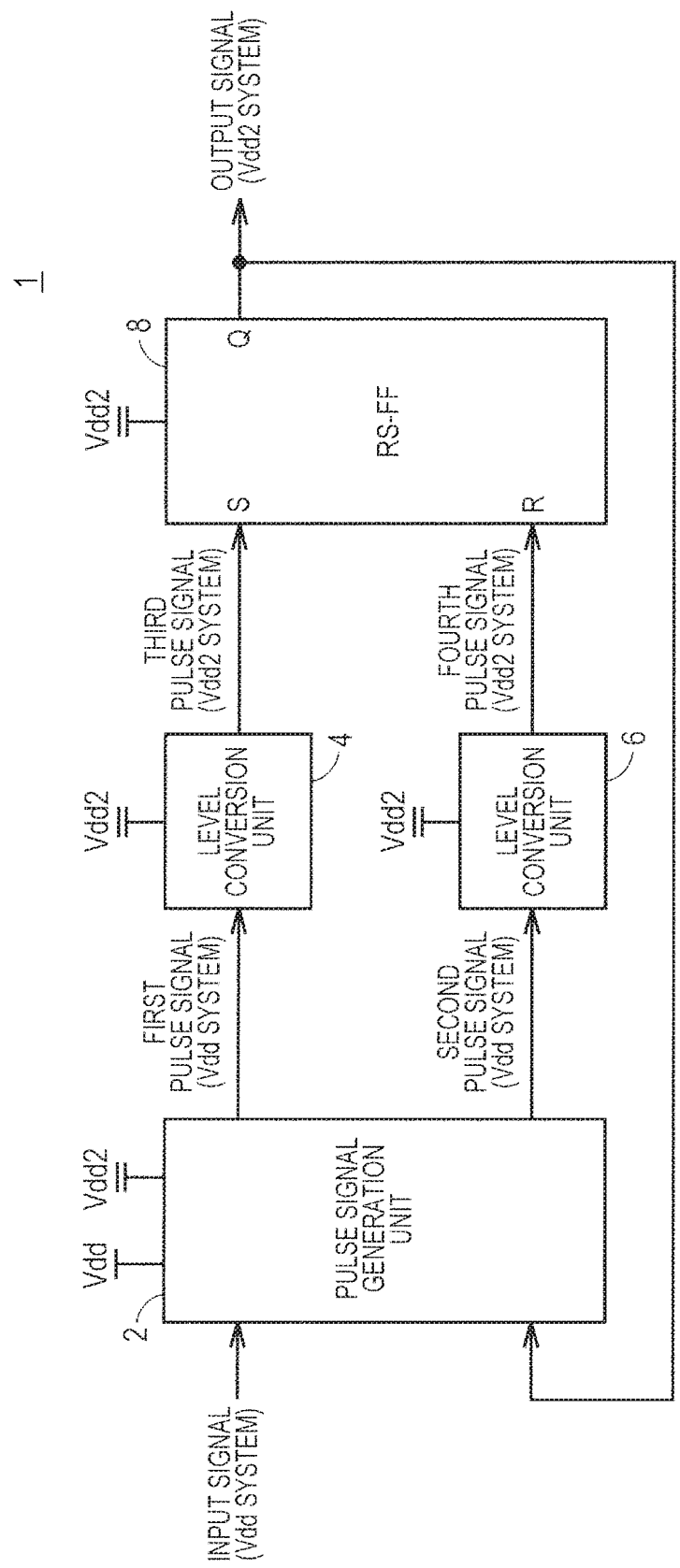
FIG. 1 is a diagram of assistance in explaining the configuration of a level shift circuit 1 according to a first embodiment.

Embodiments will be described in detail with reference to the drawings. It should be noted that the same or corresponding portions in the drawings are indicated by similar reference signs, and their description is not repeated.

First Embodiment

FIG. 1 is a diagram of assistance in explaining the configuration of a level shift circuit 1 according to a first embodiment.

Referring to FIG. 1, the level shift circuit 1 includes a pulse signal generation unit 2, level conversion units 4 and 6, and an RS flip flop circuit (RS-FF) 8.

The pulse signal generation unit 2 outputs a pulse signal (the Vdd system) based on the matching comparison result of an input signal (the Vdd system) and an output signal Q (the Vdd2 system). Specifically, the pulse signal generation unit 2 outputs a first pulse signal to the level conversion unit 4. In addition, the pulse signal generation unit 2 outputs a second pulse signal to the level conversion unit 6. In this example, the Vdd system means that the "H" level of the signal is generated by a power supply voltage Vdd. The Vdd2 system means that the "H" level of the signal is generated by a power supply voltage Vdd2. In addition, the power supply voltage Vdd2 has a voltage level higher than the power supply voltage Vdd.

The "L" level of both of the signals of the Vdd system and the Vdd2 system is generated by a ground voltage Vss. The ground voltage Vss has a voltage level lower than the power supply voltages Vdd and Vdd2.

The level conversion unit 4 converts the voltage level of the first pulse signal, and the level conversion unit 6 converts the voltage level of the second pulse signal.

Specifically, the level conversion unit 4 converts the first pulse signal of the Vdd system (a first voltage) to a third pulse signal of the Vdd2 system (a second voltage).

The level conversion unit 6 converts the second pulse signal of the Vdd system (the first voltage) to a fourth pulse signal of the Vdd2 system (the second voltage).

The RS flip flop circuit 8 holds data so that the third pulse signal is a set signal and the fourth pulse signal is a reset signal, and outputs the output signal Q (the Vdd2 system (the second voltage)).

The output signal Q (the Vdd2 system (the second voltage)) is inputted through the feedback path to the pulse signal generation unit 2.

Figure 2:
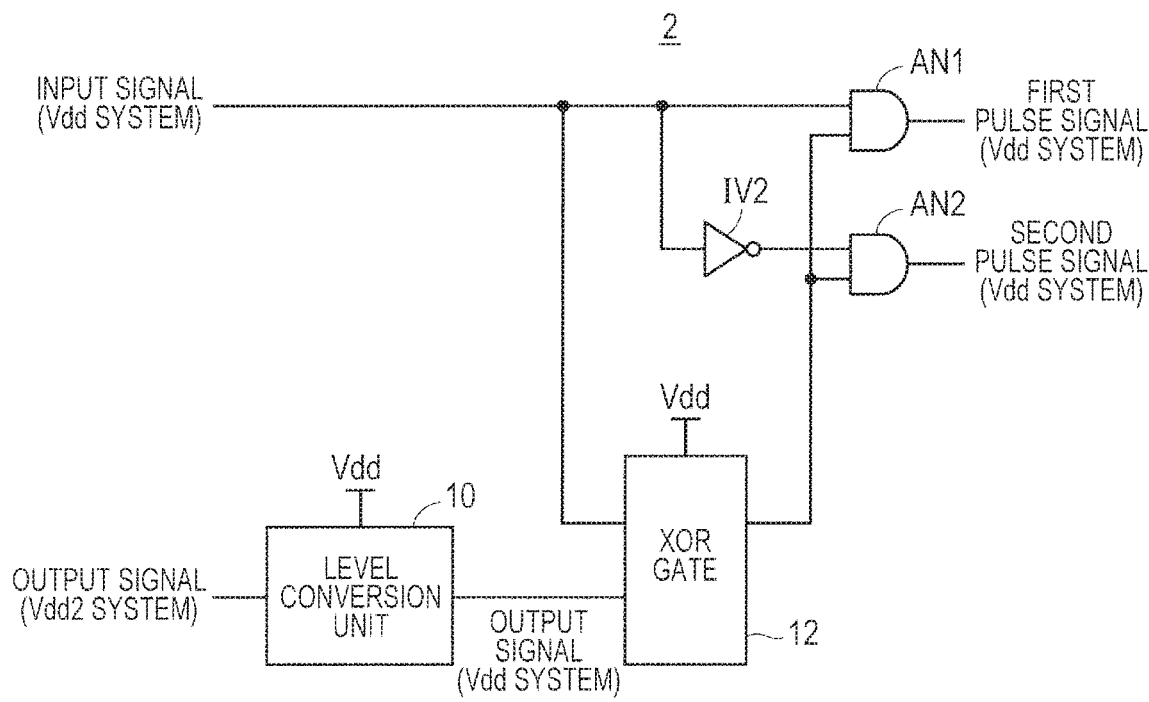
FIG. 2 is a diagram of assistance in explaining the configuration of a pulse signal generation unit 2 according to the first embodiment.

FIG. 2 is a diagram of assistance in explaining the configuration of the pulse signal generation unit 2 according to the first embodiment.

Referring to FIG. 2, the pulse signal generation unit 2 includes a level conversion unit 10, an XOR gate 12, an inverter IV2, and AND circuits AN1 and AN2.

The level conversion unit 10 converts the voltage level of the output signal Q of the Vdd2 system (the second voltage) to the Vdd system.

The XOR gate 12 executes the exclusive logical sum operation of the input signal (the Vdd system (the first voltage)) and the output signal Q (the Vdd system (the first voltage)), and outputs an exclusive logical sum operation result as the output signal.

Specifically, when the logical levels of the input signal and the output signal Q match, the "L" level is outputted, and when the logical levels of the input signal and the output signal Q do not match, the "H" level is outputted.

When the input signal rises from the "L" level to the "H" level, the output signal Q of the RS flip flop circuit 8 is at the "L" level in the initial state.

Therefore, the XOR gate 12 outputs the "H" level as non-matching. In addition, when the input signal falls from the "H" level to the "L" level, the output signal of the RS flip flop circuit 8 is at the "H" level. Therefore, the XOR gate 12 outputs the "H" level as non-matching.

The AND circuit AN1 outputs an AND logical operation result based on the input signal and the logical sum operation result of the XOR gate 12, as the first pulse signal (the Vdd system (the first voltage)).

The AND circuit AN2 outputs an AND logical operation result based on the inversion signal of the input signal through the inverter IV2 and the logical sum operation result of the XOR gate 12, as the second pulse signal (the Vdd system (the first voltage)).

When the input signal rises from the "L" level to the "H" level, the XOR gate 12 outputs the "H" level, as described above, and the AND circuit AN1 thus outputs the first pulse signal at the "H" level.

On the other hand, when the input signal falls from the "H" level to the "L" level, the XOR gate 12 outputs the "H" level, as described above, and the AND circuit AN2 thus outputs the second pulse signal at the "H" level.

Figure 3:
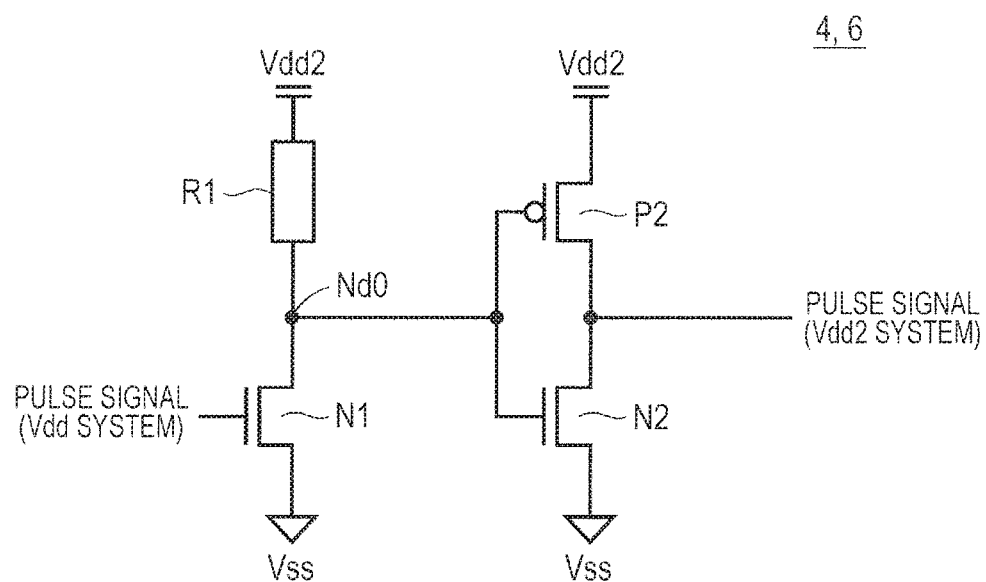
FIG. 3 is a diagram of assistance in explaining the configuration of level conversion units 4 and 6 according to the first embodiment.

FIG. 3 is a diagram of assistance in explaining the configuration of the level conversion units 4 and 6 according to the first embodiment.

Referring to FIG. 3, since both of the respective level conversion units 4 and 6 have the same configuration, the level conversion unit 4 will be mainly described, and the description of the level conversion unit 6 is omitted.

The level conversion unit 4 includes high withstand voltage N-channel MOS transistors N1 and N2, a high withstand voltage P-channel MOS transistor P2, and a load resistance element R1.

The high withstand voltage N-channel MOS transistor N1 and the load resistance element R1 configure an NMOS inverter. The high withstand voltage N-channel MOS transistor N2 and the high withstand voltage P-channel MOS transistor P2 configure a CMOS inverter.

The load resistance element R1 is coupled between the power supply voltage Vdd2 and an internal node Nd0. The high withstand voltage N-channel MOS transistor N1 is coupled between the internal node Nd0 and the ground voltage Vss, and has a gate receiving the first pulse signal (the Vdd system (the first voltage)).

The high withstand voltage P-channel MOS transistor P2 is provided between the power supply voltage Vdd2 and an output node, and has a gate coupled to the internal node Nd0.

The high withstand voltage N-channel MOS transistor N2 is provided between the output node and the ground voltage Vss, and has a gate coupled to the internal node Nd0.

When the first pulse signal (the Vdd system (the first voltage)) is at the "L" level, the high withstand voltage N-channel MOS transistor N1 is off. Therefore, the electric potential of the internal node Nd0 is held at the power supply voltage Vdd2 by the load resistance element R1. Therefore, the high withstand voltage P-channel MOS transistor P2 that receives the input from the internal node Nd0 is off, and the high withstand voltage N-channel MOS transistor N2 is on. As a result, when the first pulse signal (the Vdd system (the first voltage)) is at the "L" level, the third pulse signal (the Vdd2 system (the second voltage)) is set to the same "L" level (the ground voltage Vss) as the input signal.

When the first pulse signal (the Vdd system (the first voltage)) is at the "H" level, the high withstand voltage N-channel MOS transistor N1 is turned on. With this, the internal node Nd0 changes to the "L" level. Then, the high withstand voltage P-channel MOS transistor P2 is turned on, and the output signal is then set to the "H" level of the Vdd2 system (the second voltage). Thus, the first pulse signal is level converted from the Vdd system (the first voltage) to the Vdd2 system (the second voltage).

It should be noted that in the case of the input (the "H" level) of the pulse signal (the Vdd system (the first voltage)), the high withstand voltage N-channel MOS transistor N1 is turned on, and a steady state current is thus generated through the load resistance element R1.

This is ditto for the level conversion unit 6. The second pulse signal is level converted from the Vdd system (the first voltage) to the Vdd2 system (the second voltage).

Figure 4:
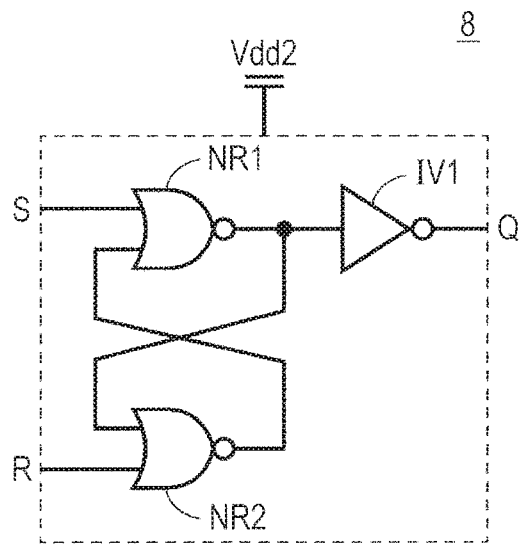
FIG. 4 is a diagram of assistance in explaining the configuration of an RS flip flop circuit 8 according to the first embodiment.

FIG. 4 is a diagram of assistance in explaining the configuration of the RS flip flop circuit 8 according to the first embodiment.

Referring to FIG. 4, the RS flip flop circuit 8 includes NOR circuits NR1 and NR2, and an inverter IV1.

It should be noted that each circuit element of the RS flip flop circuit 8 is configured of a high withstand voltage MOS transistor.

The NOR circuit NR1 receives the set signal (the third pulse signal) and the output signal of the NOR circuit NR2, and outputs an NOR logical operation result thereof. The inverter IV1 outputs the inversion signal of the NOR circuit NR1 as the output signal Q.

The NOR circuit NR2 receives the output signal of the NOR circuit NR1 and the reset signal (the fourth pulse signal), and outputs an NOR logical operation result thereof.

When the set signal (the third pulse signal (the "H" level)) is inputted, the RS flip flop circuit 8 sets the output signal Q to the "H" level.

When the reset signal (the fourth pulse signal (the "H" level)) is inputted, the RS flip flop circuit 8 sets the output signal Q to the "L" level.

When both of the set signal (the first pulse signal) and the reset signal (the second pulse signal) are at the "L" level, the RS flip flop circuit 8 holds the state.

Figure 5:
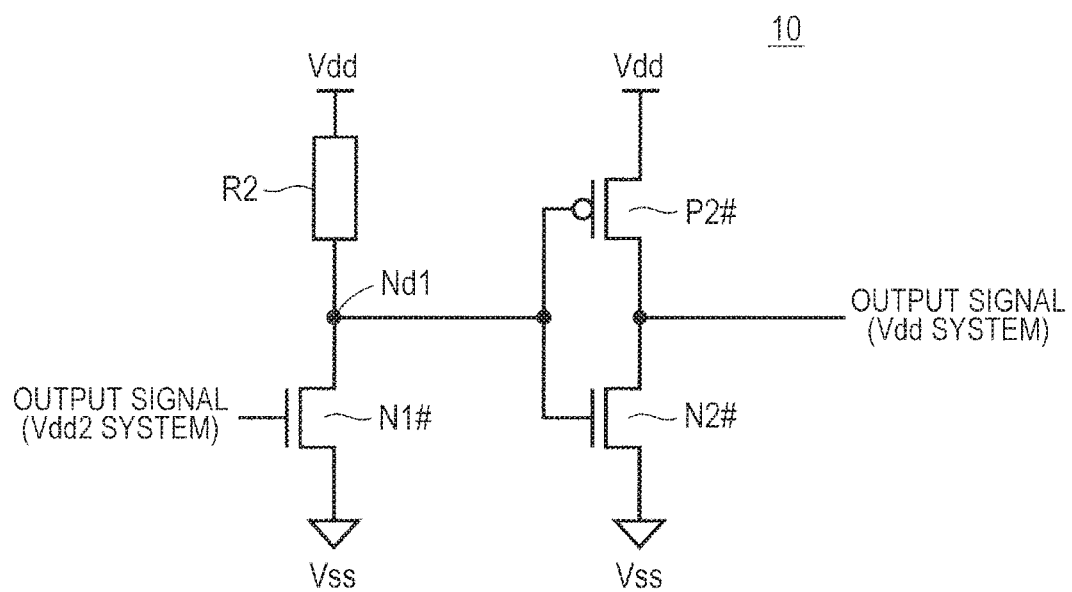
FIG. 5 is a diagram of assistance in explaining the configuration of a level conversion unit 10 according to the first embodiment.

FIG. 5 is a diagram of assistance in explaining the configuration of the level conversion unit 10 according to the first embodiment.

Referring to FIG. 5, the level conversion unit 10 includes a high withstand voltage N-channel MOS transistor N1#, a low withstand voltage P-channel MOS transistor P2#, a low withstand voltage N-channel MOS transistor N2#, and a load resistance element R2.

The high withstand voltage N-channel MOS transistor N1# and the load resistance element R2 configure an NMOS inverter. The low withstand voltage N-channel MOS transistor N2# and the low withstand voltage P-channel MOS transistor P2# configure a CMOS inverter.

The load resistance element R2 is coupled between the power supply voltage Vdd and an internal node Nd1. The high withstand voltage N-channel MOS transistor N1# is coupled between the internal node Nd1 and the ground voltage Vss, and has a gate receiving the output signal (the Vdd2 system (the second voltage)).

The low withstand voltage P-channel MOS transistor P2# is provided between the power supply voltage Vdd and an output node, and has a gate coupled to the internal node Nd1.

The low withstand voltage N-channel MOS transistor N2# is provided between the output node and the ground voltage Vss, and has a gate coupled to the internal node Nd1.

When the output signal (the Vdd2 system (the second voltage)) is at the "L" level, the high withstand voltage N-channel MOS transistor N1# is off. Therefore, the electric potential of the internal node Nd1 is held at the power supply voltage Vdd by the load resistance element R2. Therefore, the low withstand voltage P-channel MOS transistor P2# that receives the input from the internal node Nd1 is off, and the low withstand voltage N-channel MOS transistor N2# is on. As a result, when the output signal (the Vdd2 system (the second voltage)) is at the "L" level, the output signal (the Vdd system (the first voltage)) is set to the same "L" level (the ground voltage Vss) as the input signal.

When the output signal (the Vdd2 system (the second voltage)) is at the "H" level, the high withstand voltage N-channel MOS transistor N1# is turned on. With this, the internal node Nd1 changes to the "L" level. Then, the low withstand voltage P-channel MOS transistor P2# is turned on, and the output signal is then set to the "H" level of the Vdd system (the first voltage). Thus, the output signal is level converted from the Vdd2 system (the second voltage) to the Vdd system (the first voltage).

Figure 6:
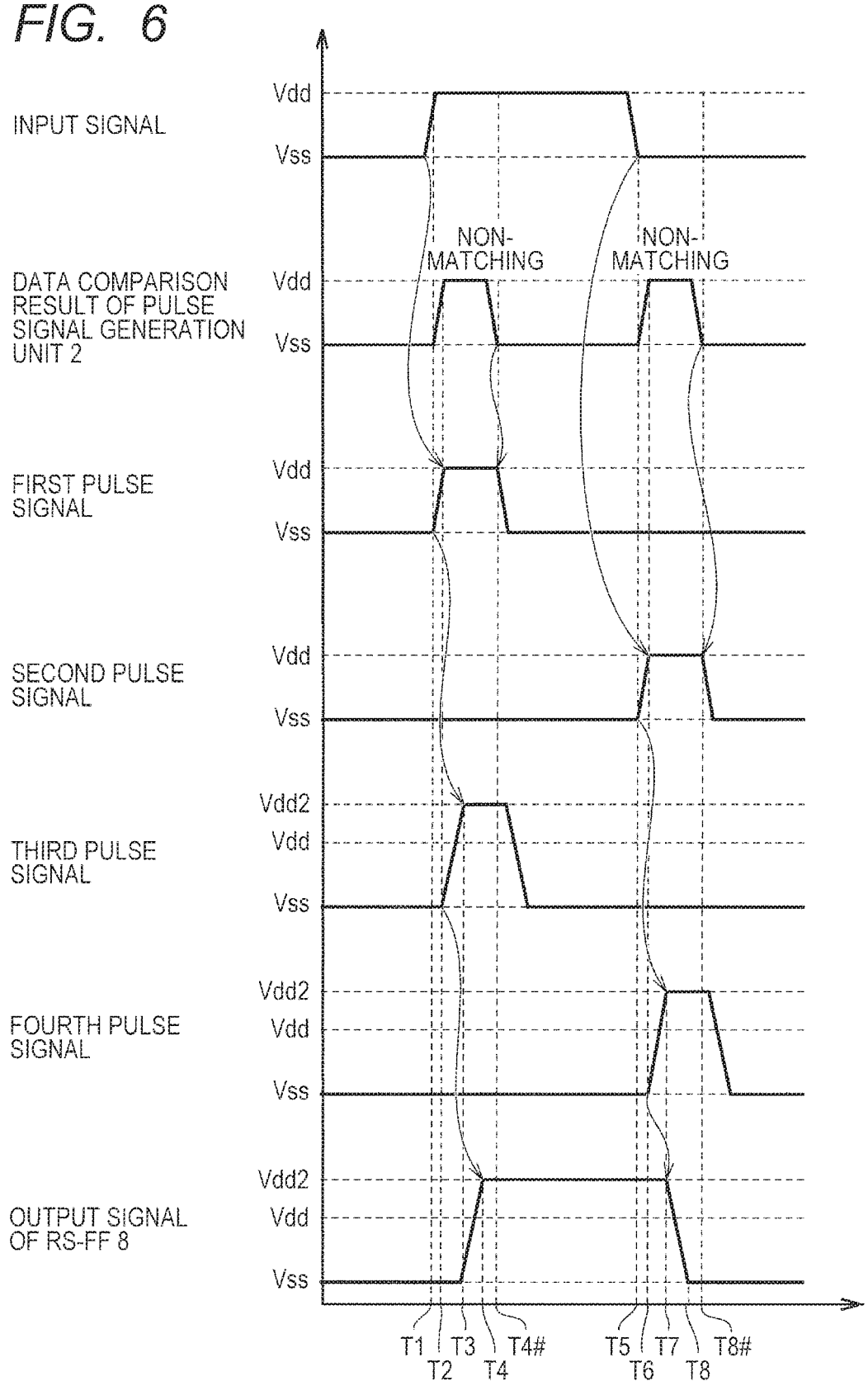
FIG. 6 is a timing chart of assistance in explaining the operation of the level shift circuit 1 according to the first embodiment.

FIG. 6 is a timing chart of assistance in explaining the operation of the level shift circuit 1 according to the first embodiment.

As illustrated in FIG. 6, at time T1, the input signal changes from the "L" level to the "H" level.

At time T2, the XOR gate 12 outputs the "H" level as the exclusive logical sum operation result of the input signal (the "H" level) and the output signal Q (the "L" level).

Therefore, the AND circuit AN1 outputs the first pulse signal (the "H" level). That is, the pulse signal generation unit 2 outputs the first pulse signal of the Vdd system (the first voltage).

At time T3, the level conversion unit 4 outputs the third pulse signal of the Vdd2 system (the second voltage) according to the first pulse signal of the Vdd system (the first voltage).

At time T4, the RS flip flop circuit 8 sets the output signal Q to the "H" level according to the set signal (the third pulse signal).

At time T4#, the XOR gate 12 outputs the "L" level as the exclusive logical sum operation result of the input signal (the "H" level) and the output signal Q (the "H" level). With this, the AND circuit AN1 sets the first pulse signal to the "L" level. Then, the third pulse signal is also set to the "L" level.

According to this sequence of operation, the level shift circuit 1 completes the level conversion operation that converts the output signal from the "L" level to the "H" level at the time of the change of the input signal from the "L" level to the "H" level.

At time T5, the input signal changes from the "H" level to the "L" level.

At time T6, the XOR gate 12 outputs the "H" level as the exclusive logical sum operation result of the input signal (the "L" level) and the output signal Q (the "H" level).

Therefore, the AND circuit AN2 outputs the second pulse signal (the "H" level). That is, the pulse signal generation unit 2 outputs the second pulse signal of the Vdd system (the first voltage).

At time T7, the level conversion unit 6 outputs the fourth pulse signal of the Vdd2 system (the second voltage) according to the second pulse signal of the Vdd system (the first voltage).

At time T8, the RS flip flop circuit 8 sets the output signal Q to the "L" level according to the reset signal (the fourth pulse signal).

At time T8#, the XOR gate 12 outputs the "L" level as the exclusive logical sum operation result of the input signal (the "L" level) and the output signal Q (the "L" level). With this, the AND circuit AN2 sets the second pulse signal to the "L" level. Then, the fourth pulse signal is also set to the "L" level.

According to this sequence of operation, the level shift circuit 1 completes the level conversion operation that converts the output signal from the "H" level to the "L" level at the time of the change of the input signal from the "H" level to the "L" level.

As described above, in the level shift circuit 1 according to the first embodiment, the pulse signal generation unit 2 stops the pulse signal generation when the level conversion is achieved.

In the conventional method, under the operation conditions in which the pulse width of the set signal/the reset signal inputted to the RS flip flop circuit becomes long, when the data rate is excessively increased, the set signal and the reset signal overlap with each other, and consequently, there is a possibility that the RS flip flop circuit malfunctions.

On the other hand, in the level shift circuit 1 according to the first embodiment, since the XOR gate 12 changes the output signal to the "L" level at the appropriate timing, the set signal and the reset signal are difficult to overlap with each other, so that the data rate can be increased.

In the level shift circuit 1 according to the first embodiment, even when the pulse width necessary for the level conversion changes with the operation environment change in the temperature, the power supply voltage, and the like, the minimum necessary pulse signal is automatically generated so as to adapt to this. Thus, while stable level conversion is achieved, the low electric current consumption properties and the high-speed operability can be satisfied at the same time.

In addition, when the latch data of the RS flip flop circuit is inverted due to noise, software error, and the like, the pulse signal generation unit 2 generates a new pulse signal at detecting the non-matching state of the input and output data, so that the level conversion is performed again by the level conversion units 4 and 6, and correct data is set to the RS flip flop circuit again.

A Modification of First Embodiment

In the level conversion unit 4 of the first embodiment, when the power supply voltage Vdd lowers to near the threshold voltage of the high withstand voltage N-channel MOS transistor, the on resistance of the high withstand voltage N-channel MOS transistor 1 increases, and consequently, there is a possibility that the level conversion is not performed as well as the conversion time increases.

Specifically, in the inverter of the high withstand voltage N-channel MOS transistor N1 at the preceding stage, when the on resistance of the high withstand voltage N-channel MOS transistor N1 increases to the level equivalent to the resistance value of the load resistance element R1, the "L" level of the output of the inverter of the N-channel MOS transistor N1 does not lower, thereby not reaching the logical threshold value of the CMOS inverter at the following stage. Consequently, in the level conversion unit 4, the "H" level cannot be outputted, or only the "L" level is outputted.

When the resistance value of the load resistance element R1 is set high to solve the above problems, the problem of the lowering of the data rate due to the increase of the delay time at changing to the "L" level in the level conversion unit 4, and the like arises.

Figure 7:
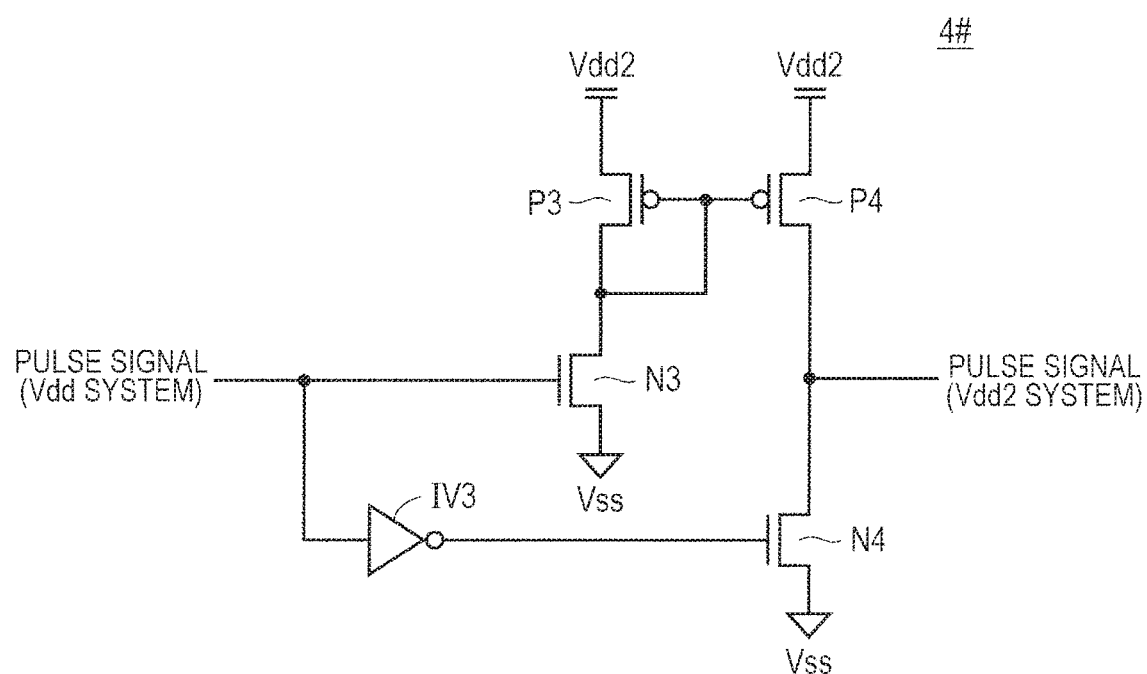
FIG. 7 is a diagram of assistance in explaining the configuration of a level conversion unit 4# according to a modification of the first embodiment.

FIG. 7 is a diagram of assistance in explaining the configuration of a level conversion unit 4# according to a modification of the first embodiment.

Referring to FIG. 7, the level conversion unit 4# according to the modification of the first embodiment is provided to be replaceable with the level conversion unit 4. This is ditto for a level conversion unit 6# provided to be replaceable with the level conversion unit 6.

The level conversion unit 4# includes high withstand voltage P-channel MOS transistors P3 and P4, high withstand voltage N-channel MOS transistors N3 and N4, and an inverter IV3 formed of a low withstand voltage MOS transistor.

The high withstand voltage P-channel MOS transistors P3 and P4 configure a current mirror circuit. The high withstand voltage P-channel MOS transistor P4 is provided between the power supply voltage Vdd2 and an output node, and has a gate coupled to the gate of the high withstand voltage P-channel MOS transistor P3.

The high withstand voltage N-channel MOS transistor N4 is provided between the output node and the ground voltage Vss, and has a gate receiving the inversion signal of the first pulse signal (the Vdd system) through the inverter IV3.

The high withstand voltage P-channel MOS transistor P3 is provided between the power supply voltage Vdd2 and the high withstand voltage N-channel MOS transistor N3, and has a gate coupled to its drain.

The high withstand voltage N-channel MOS transistor N3 is provided between the high withstand voltage P-channel MOS transistor P3 and the ground voltage Vss, and has a gate receiving the first pulse signal (the Vdd system).

When the first pulse signal (the Vdd system) is at the "H" level, the high withstand voltage N-channel MOS transistor N3 is turned on. On the other hand, the high withstand voltage N-channel MOS transistor N4 is turned off.

With this, an electric current flows in the high withstand voltage P-channel MOS transistor P3 and the high withstand voltage N-channel MOS transistor N3. The electric current also flows in the high withstand voltage P-channel MOS transistor P4 by the current mirror circuit, and the third pulse signal of the output signal is set to the "H" level of the power supply voltage Vdd2 system. Thus, the first pulse signal of the Vdd system is level converted to the third pulse signal of the Vdd2 system.

This is ditto for the level conversion unit 6#. The second pulse signal of the Vdd system is level converted to the fourth pulse signal of the Vdd2 system.

As compared with the level conversion unit 4, in the level conversion unit 4#, the load resistance element R1 that is the pull-up element of the inverter at the preceding stage is changed to the diode-coupled P-channel MOS transistor P3.

Thus, when the first pulse signal is at the "H" level, the gate potential of the P-channel MOS transistor P3 becomes the power supply voltage Vdd2−|Vth_P3|. The Vth_P3 is the threshold voltage of the P-channel MOS transistor P3.

The inversion of the input signal is inputted to the N-channel MOS transistor N3 of the CMOS inverter at the following stage to turn off the N-channel MOS transistor N3, so that the logical threshold value of the CMOS inverter at the following stage is set to be higher than Vdd2−|Vth_P3|.

Thus, without depending on the power supply Vdd, the output potential of the inverter at the preceding stage is lower than the logical threshold value of the CMOS inverter at the following stage. Thus, in the CMOS inverter at the following stage, the "H" level of the third pulse signal of the power supply voltage Vdd2 can be stably outputted.

In addition, as described above, in the level conversion unit 4, there is a possibility that the falling speed of the "L" level lowers, but in the level conversion unit 4#, when the first pulse signal is at the "L" level, the N-channel MOS transistor N4 is turned on, so that the falling operation of the "L" level of the third pulse signal is performed at high speed.

Second Embodiment

In a second embodiment, a method that copes with the metastable state in the RS flip flop circuit will be described.

The metastable state represents a state where the latch node is not stable at the ground voltage Vss and the power supply voltage Vdd2, but is stable at an intermediate potential thereof. When the data transition of the input signal occurs, the set signal or the reset signal is inputted to the RS flip flop circuit, so that the RS flip flop circuit can escape from the metastable state, but until the escape, there is a possibility that a flow-through current is generated in the RS flip flop circuit.

In addition, not only the latch in the RS flip flop circuit, but also the path from the RS flip flop circuit to the pulse signal generation unit 2, is present. Depending on the circuit configuration, the RS flip flop circuit is at the stable point where the RS flip flop circuit is not in the metastable state, and even at the input signal transition, there is also a possibility that the RS flip flop circuit cannot escape from the metastable state.

Figure 8:
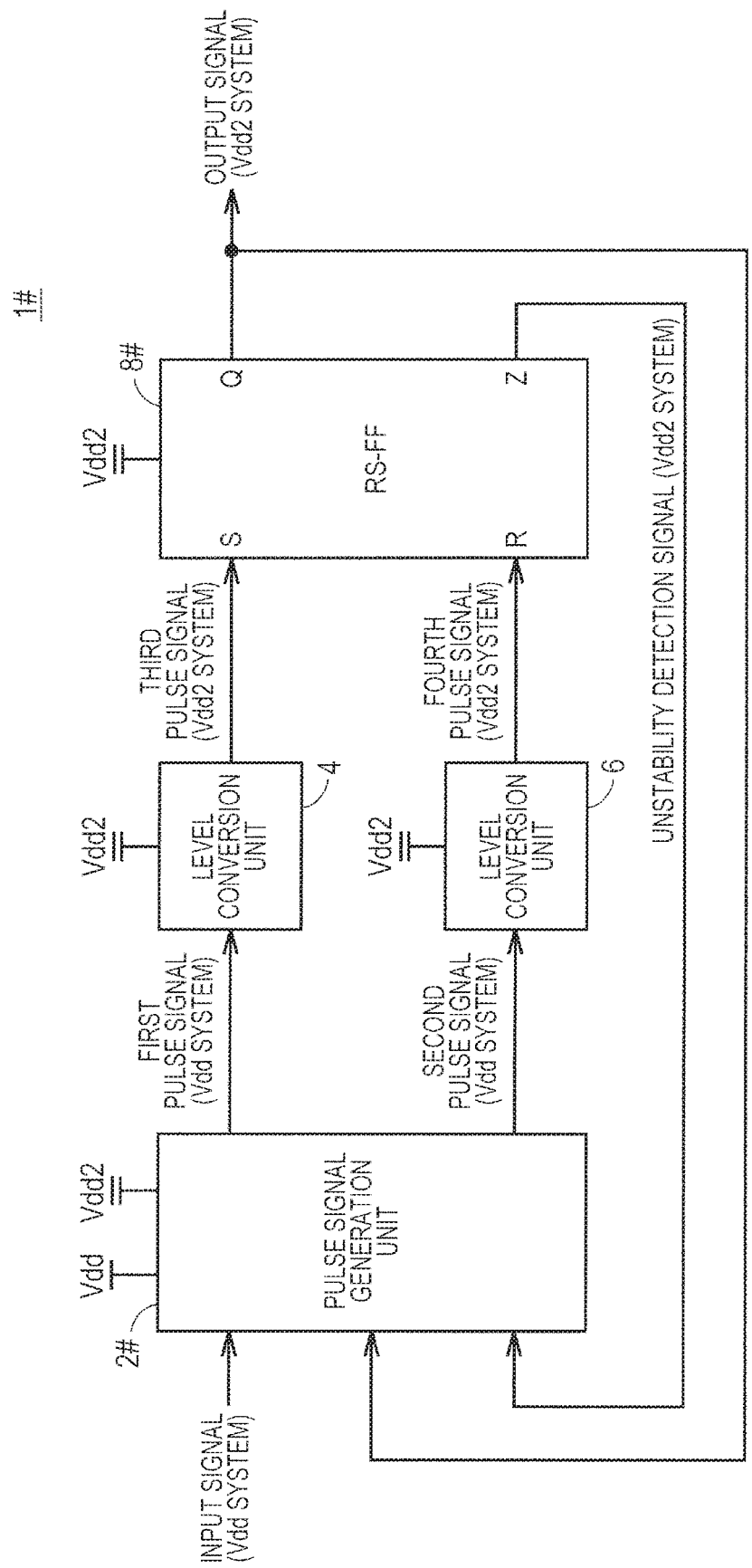
FIG. 8 is a diagram of assistance in explaining the configuration of a level shift circuit 1# according to a second embodiment.

FIG. 8 is a diagram of assistance in explaining the configuration of a level shift circuit 1# according to the second embodiment.

Referring to FIG. 8, the level shift circuit 1# is different from the level shift circuit 1 in that the pulse signal generation unit 2 is replaced with a pulse signal generation unit 2#, and the RS flip flop circuit (RS-FF) 8 is replaced with an RS flip flop circuit 8#. Other configurations are the same as the level shift circuit 1, and their detailed description is not repeated.

The pulse signal generation unit 2# outputs the pulse signal (the Vdd system) based on the matching comparison result of the input signal (the Vdd system), a first output signal (the Vdd2 system), and a second output signal (the Vdd2 system).

Specifically, like the pulse signal generation unit 2 according to the first embodiment, the pulse signal generation unit 2# outputs the first and second pulse signals to the level conversion units 4 and 6, respectively, based on the matching comparison result of the input signal and the first output signal. Further, the pulse signal generation unit 2# outputs the first and second pulse signals to the level conversion units 4 and 6, respectively, based on the state (the "H" level) of the second output signal.

In this example, the level conversion unit 4 converts the voltage level of the first pulse signal to output the third pulse signal, and the level conversion unit 6 converts the voltage level of the second pulse signal to output the fourth pulse signal.

Specifically, the level conversion unit 4 converts the first pulse signal of the Vdd system to the third pulse signal of the Vdd2 system, and outputs the third pulse signal of the Vdd2 system.

The level conversion unit 6 converts the second pulse signal of the Vdd system to the fourth pulse signal of the Vdd2 system, and outputs the fourth pulse signal of the Vdd2 system.

The RS flip flop circuit 8# outputs the first output signal (the Vdd2 system) so that the third pulse signal is the set signal and the fourth pulse signal is the reset signal. In addition, in this example, the second output signal (the Vdd2 system) is outputted.

The first and second output signals (the Vdd2 system) are inputted through the feedback path to the pulse signal generation unit 2.

Figure 9:
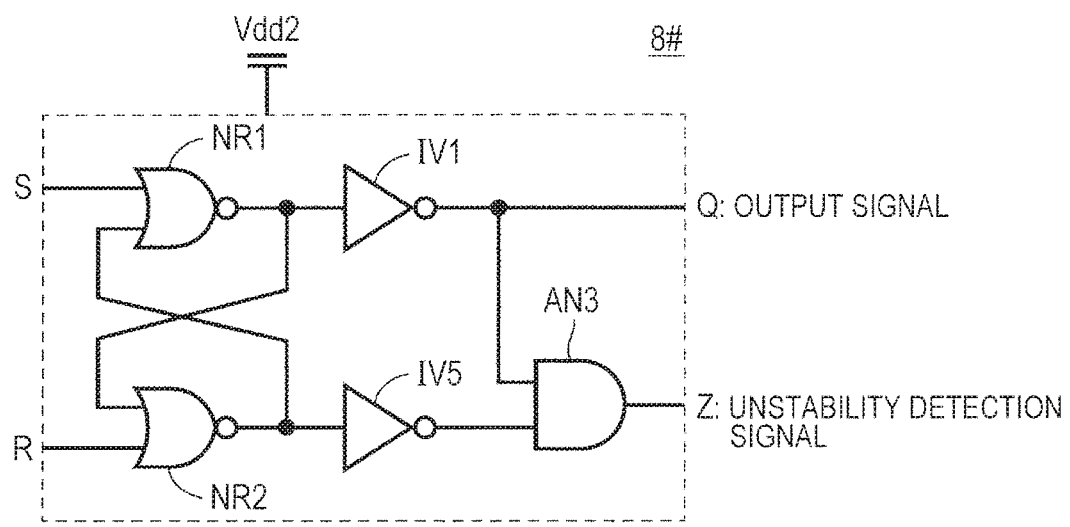
FIG. 9 is a diagram of assistance in explaining the configuration of an RS flip flop circuit 8# according to the second embodiment.

FIG. 9 is a diagram of assistance in explaining the configuration of the RS flip flop circuit 8# according to the second embodiment.

The RS flip flop circuit 8# is different from the RS flip flop circuit 8 in that the metastable state is outputted as the second output signal (unstability detection signal).

Referring to FIG. 9, the RS flip flop circuit 8# is different from the RS flip flop circuit 8 in that the RS flip flop circuit 8# further includes an inverter IV5 and an AND circuit AN3.

The inverter IV5 inverts the output signal of the NOR circuit NR2 to output the inverted output signal to the AND circuit AN3.

The AND circuit AN3 outputs the AND logical operation result of the inverter IV1 and the inverter IV5 as an unstability detection signal Z (the Vdd2 system).

In this example, when the latch node of the RS flip flop circuit 8# is at the intermediate potential, the threshold value of the inverters IV1 and IV5 is adjusted so as to output the "H" level.

Specifically, for the adjustment of the threshold value of the inverters IV1 and IV5, the logical threshold value of the inverter IV1 and IV5 is set to be lower than the logical threshold value of the NOR circuits NR1 and NR2. This is because the intermediate potential of the latch node in the metastable state is set according to the logical threshold value of the NOR circuits NR1 and NR2.

In the RS flip flop circuit 8#, during the normal state, one of the NOR circuits NR1 and NR2 outputs the "H" level, and the other outputs the "L" level.

Therefore, the AND circuit AN3 does not output the unstability detection signal Z at the "H" level.

On the other hand, in the case of the metastable state, the latch node is maintained at the intermediate potential. Thus, both of the inverters IV1 and IV5 output the "H" level. Therefore, the AND circuit AN3 outputs the unstability detection signal Z at the "H" level.

It should be noted that in this example, the case where in the case of the metastable state, both of the inverters IV1 and IV5 output the "H" level will be described, but in particular, the present invention is not limited to the configuration. By adjusting the threshold value of the inverters IV1 and IV5, in the case of the metastable state, both of the inverters IV1 and IV5 output the "L" level, so that the present invention can also be designed so that the unstability detection signal Z is at the "H" level.

Figure 10:
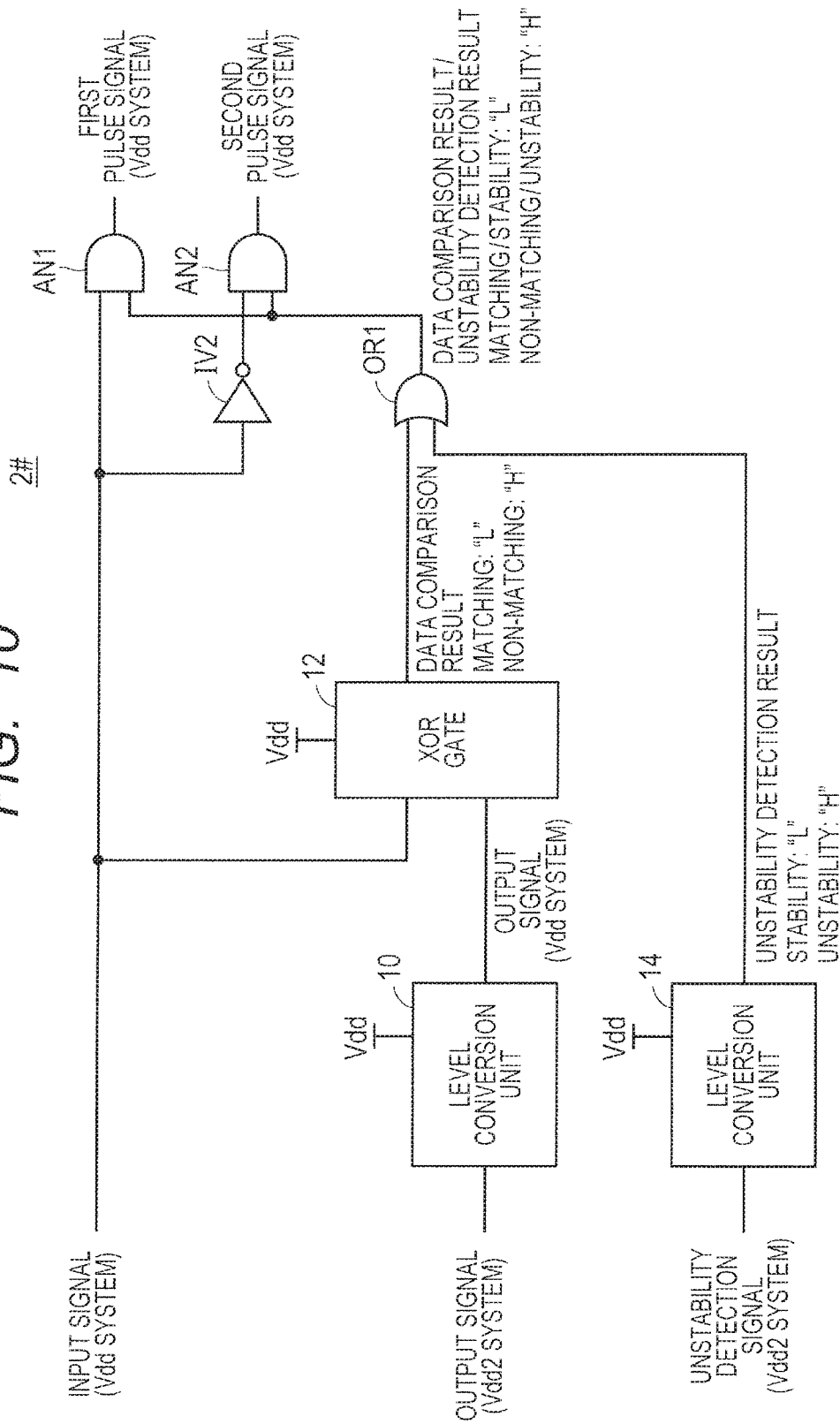
FIG. 10 is a diagram of assistance in explaining a pulse signal generation unit 2# according to the second embodiment.

FIG. 10 is a diagram of assistance in explaining the pulse signal generation unit 2# according to the second embodiment.

Referring to FIG. 10, the pulse signal generation unit 2# is different from the pulse signal generation unit 2 described in FIG. 2 in that the pulse signal generation unit 2# further includes a level conversion unit 14 and an OR circuit OR1. Other configurations are the same as the pulse signal generation unit 2, and their detailed description is not repeated.

The level conversion unit 14 converts the voltage level of the unstability detection signal Z.

Specifically, the level conversion unit 14 converts the unstability detection signal Z of the Vdd2 system to the Vdd system.

The OR circuit OR1 outputs the OR logical operation result of the exclusive logical sum operation result of the XOR gate 12 and the output signal of the level conversion unit 14 to each of the AND circuits AN1 and AN2.

Therefore, when the unstability detection signal Z (the "H" level) is inputted, the first pulse signal is outputted from the AND circuit AN1, and the second pulse signal is outputted from the AND circuit AN2.

When the unstability detection signal Z (the "H" level) is outputted, the latch node of the RS flip flop circuit 8# is maintained at the intermediate potential. In this case, both of the inverters IV1 and IV5 output the "H" level.

In this state, when the set signal or the reset signal is outputted to the RS flip flop circuit 8#, one of the output signals of the NOR circuits NR1 and NR2 changes to the "L" level, and the other changes to the "H" level. Thus, the output signal Q of the RS flip flop circuit 8# and the unstability detection signal Z are set again.

Therefore, the unstable state of the latch data of the RS flip flop circuit 8# can be eliminated.

Figure 11:
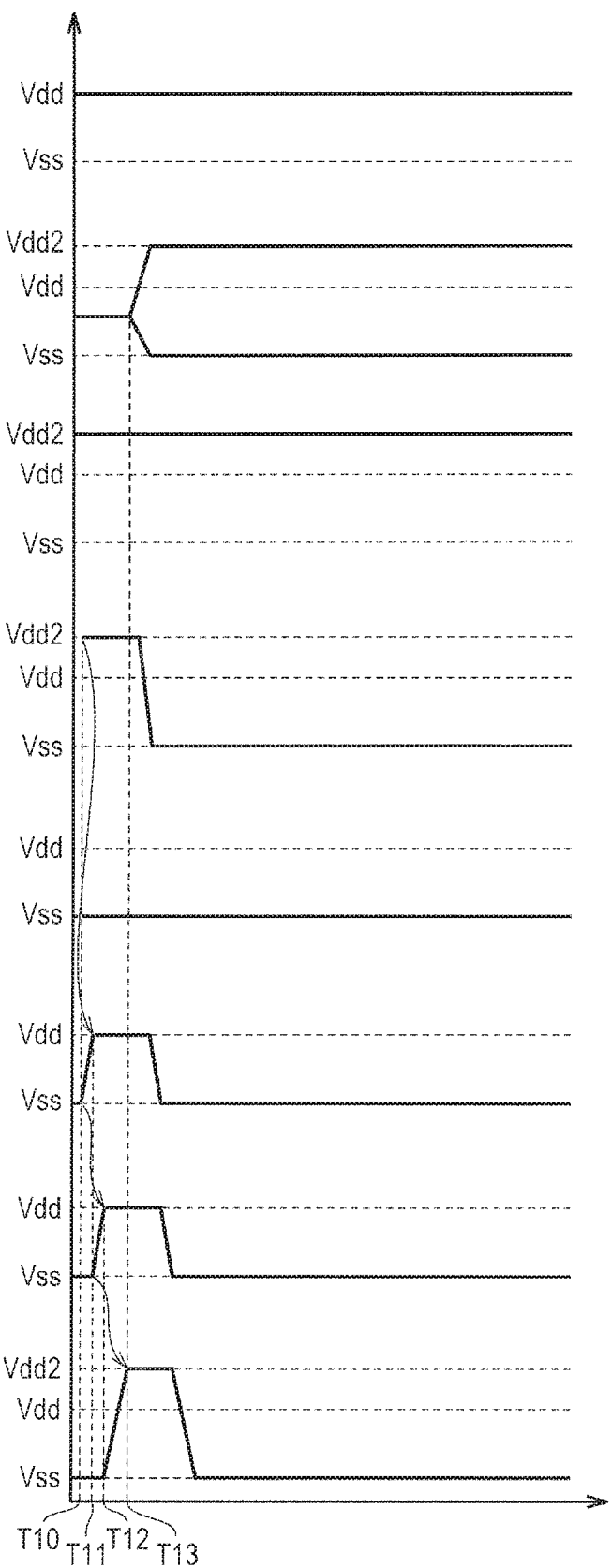
FIG. 11 is a timing chart of assistance in explaining the operation of the level shift circuit 1# according to the second embodiment.

FIG. 11 is a timing chart of assistance in explaining the operation of the level shift circuit 1# according to the second embodiment.

As illustrated in FIG. 11, at time T10, the latch node of the RS flip flop circuit 8# is maintained at the intermediate potential to output the unstability detection signal Z (the "H" level). That is, the case of the metastable state is illustrated.

Next, the unstability detection signal Z is inputted through the feedback path to the pulse signal generation unit 2#.

At time T11, the OR circuit OR1 outputs the OR logical operation result at the "H" level to each of the AND circuits AN1 and AN2 according to the unstability detection signal Z.

At time T12, the AND circuit AN1 outputs the first pulse signal (the "H" level) according to the input signal at the "H" level and the output signal of the OR circuit OR1 at the "H" level (the OR logical operation result).

That is, the pulse signal generation unit 2# outputs the first pulse signal of the Vdd system.

At time T13, the level conversion unit 4 outputs the third pulse signal of the Vdd2 system according to the first pulse signal of the Vdd system.

Next, at the time T13, the RS flip flop circuit 8# sets the output signal Q to the "H" level according to the set signal (the third pulse signal).

In this case, the latch node is set to the power supply voltage Vdd2 and the ground voltage Vss, not to the intermediate potential.

As described above, when the metastable state is detected, the set signal or the reset signal is inevitably inputted to the RS flip flop circuit 8# according to the value of the input signal, so that the RS flip flop circuit 8# can escape from the metastable state, and the consumption period of the flow-through current can be shortened.

First Modification of Second Embodiment

Figure 12:
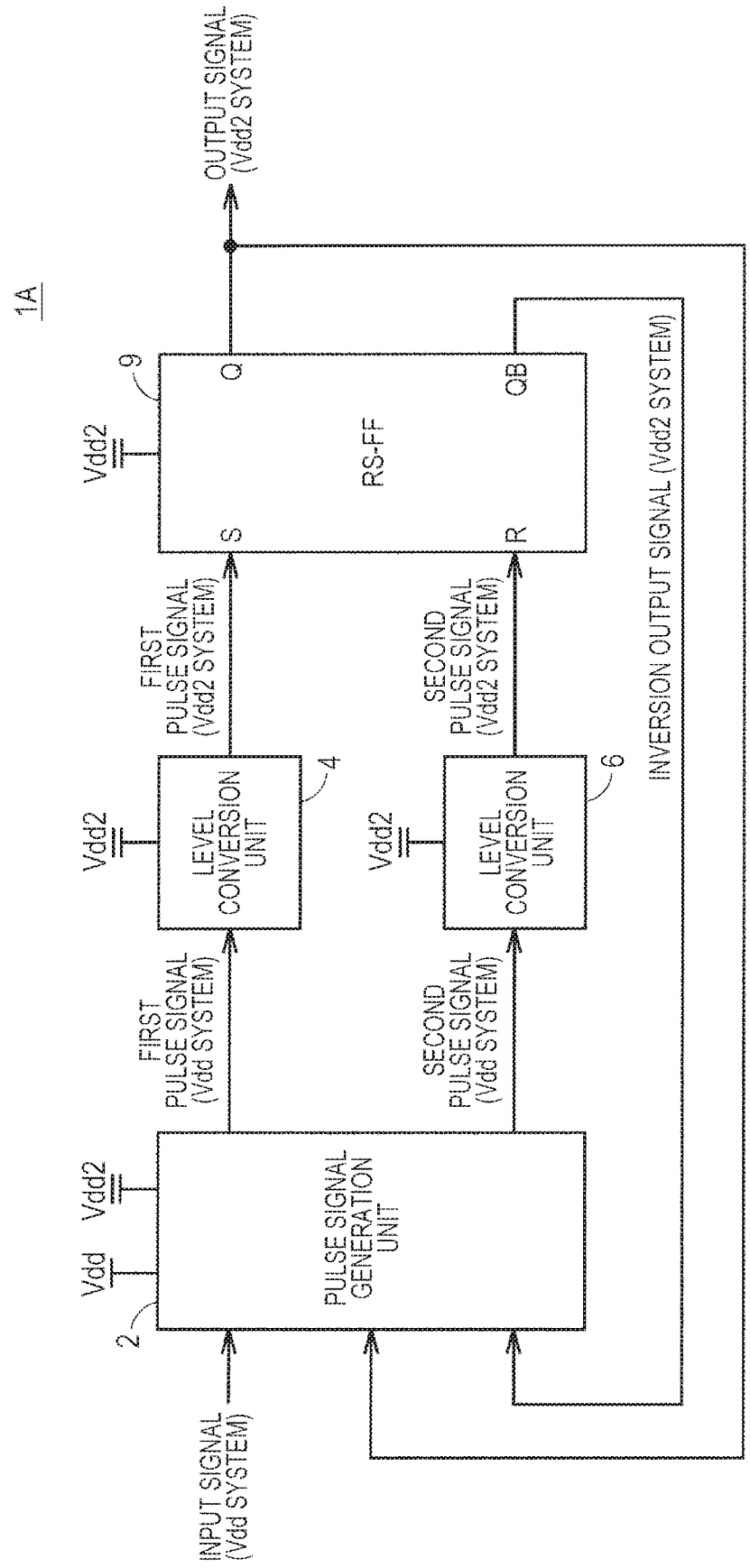
FIG. 12 is a diagram of assistance in explaining the configuration of a level shift circuit 1A according to a first modification of the second embodiment.

FIG. 12 is a diagram of assistance in explaining a level shift circuit 1A according to a first modification of the second embodiment.

Referring to FIG. 12, the level shift circuit 1A is different from the level shift circuit 1 in that the RS flip flop circuit 8 is replaced with an RS flip flop circuit 9, and the pulse signal generation unit 2 is replaced with a pulse signal generation unit 3. Other configurations are the same as the level shift circuit 1, and their detailed description is not repeated.

The pulse signal generation unit 3 outputs the pulse signal (the Vdd system) based on the matching comparison result of the input signal (the Vdd system), the first output signal (the Vdd2 system), and a third output signal (the Vdd2 system). Specifically, the pulse signal generation unit 3 outputs the first pulse signal to the level conversion unit 4. The pulse signal generation unit 3 outputs the second pulse signal to the level conversion unit 6. In this example, the level conversion unit 4 converts the voltage level of the first pulse signal to output the third pulse signal, and the level conversion unit 6 converts the voltage level of the second pulse signal to output the fourth pulse signal.

Specifically, the level conversion unit 4 converts the first pulse signal of the Vdd system to the third pulse signal of the Vdd2 system, and outputs the third pulse signal of the Vdd2 system.

The level conversion unit 6 converts the second pulse signal of the Vdd system to the fourth pulse signal of the Vdd2 system, and outputs the fourth pulse signal of the Vdd2 system.

The RS flip flop circuit 9 outputs the first output signal (the Vdd2 system) so that the third pulse signal is the set signal and the fourth pulse signal is the reset signal. In addition, in this example, the third output signal (the Vdd2 system) is outputted.

The first and third output signals (the Vdd2 system) are inputted through the feedback path to the pulse signal generation unit 3.

Figure 13:
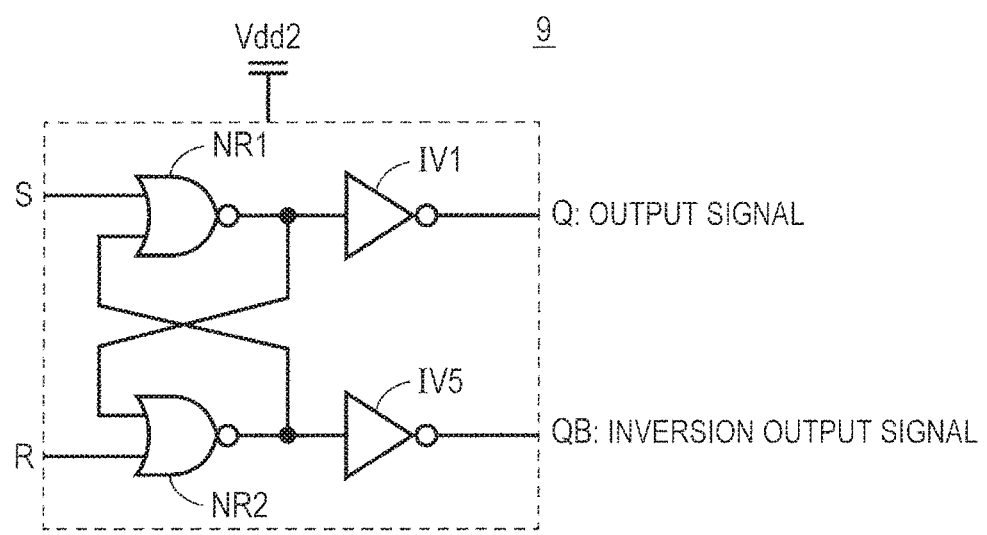
FIG. 13 is a diagram of assistance in explaining the configuration of an RS flip flop circuit 9 according to the first modification of the second embodiment.

FIG. 13 is a diagram of assistance in explaining the configuration of the RS flip flop circuit 9 according to the first modification of the second embodiment.

Referring to FIG. 13, the RS flip flop circuit 9 is different from the RS flip flop circuit 8# illustrated in FIG. 9 in that the AND circuit AN3 is removed. Other configurations are the same as the RS flip flop circuit 8#, and their detailed description is not repeated.

The output signal Q of the inverter IV1 and the inversion output signal QB of the inverter IV5 are inputted to the pulse signal generation unit 3. The inversion output signal QB is outputted as the inversion signal of the output signal Q according to the latch data during the normal state.

In the case of the metastable state, both of the output signal Q and the inversion output signal QB are inputted to the pulse signal generation unit 3 as the output signals at the "H" level.

Figure 14:
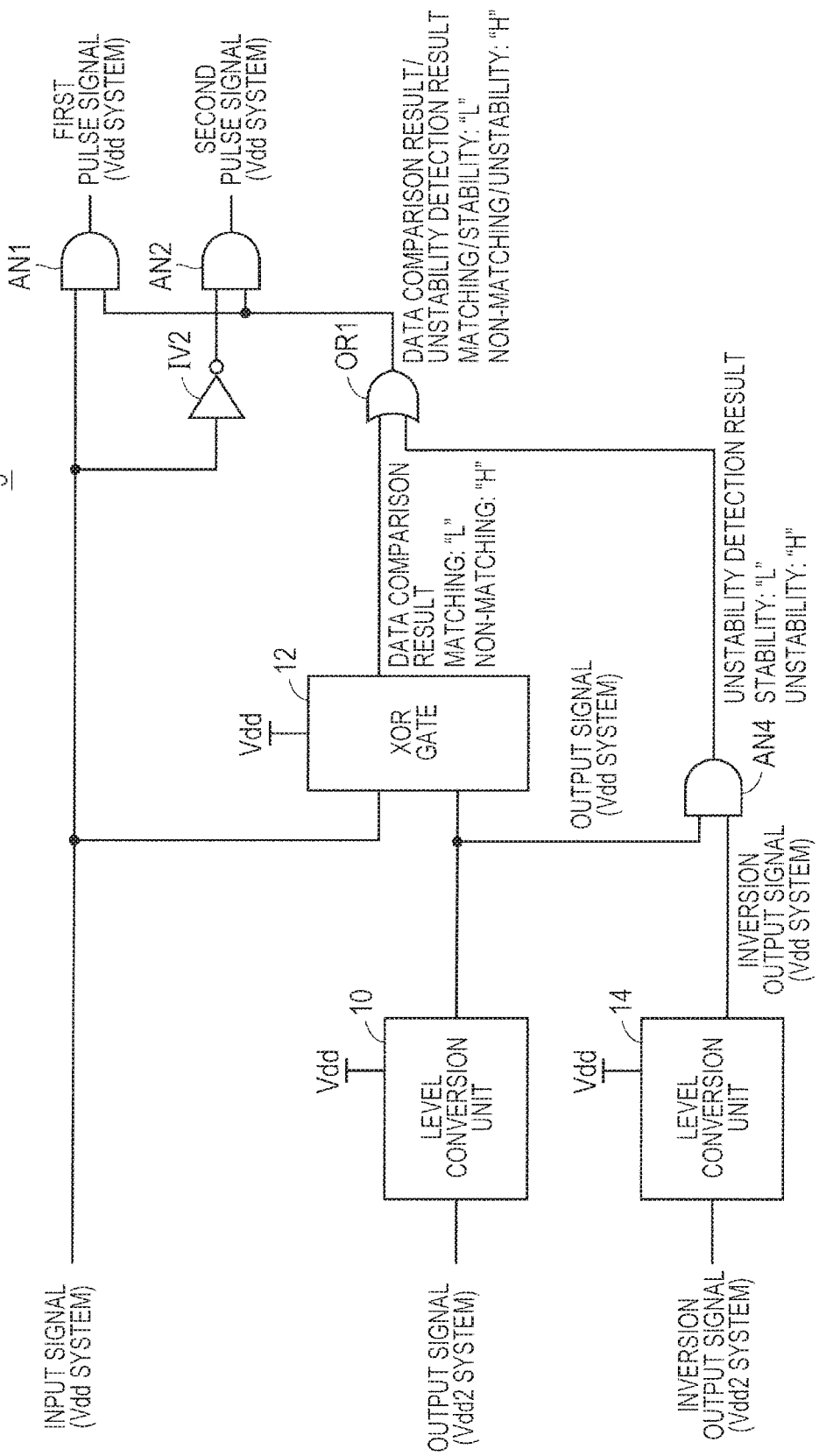
FIG. 14 is a diagram of assistance in explaining a pulse signal generation unit 3 according to the first modification of the second embodiment.

FIG. 14 is a diagram of assistance in explaining the pulse signal generation unit 3 according to the first modification of the second embodiment.

Referring to FIG. 14, the pulse signal generation unit 3 according to the first modification of the second embodiment is different from the pulse signal generation unit 2# in that the pulse signal generation unit 3 further includes an AND circuit AN4. Other configurations are the same as the pulse signal generation unit 2#, and their detailed description is not repeated.

The AND circuit AN4 outputs the AND logical operation result of the output signal of the level conversion unit 10 and the output signal of the level conversion unit 14 to the OR circuit OR1.

That is, the AND circuit AN3 provided in the RS flip flop circuit 8# is removed, and the AND circuit AN4 is added to the pulse signal generation unit 3.

The AND circuit AN3 includes a high withstand voltage transistor having a large area, but the AND circuit AN4 includes a low withstand voltage transistor having a small area.

Therefore, by changing the arrangement of the AND circuit, the area of the level shift circuit can be smaller as a whole.

Second Modification of Second Embodiment

Figure 15:
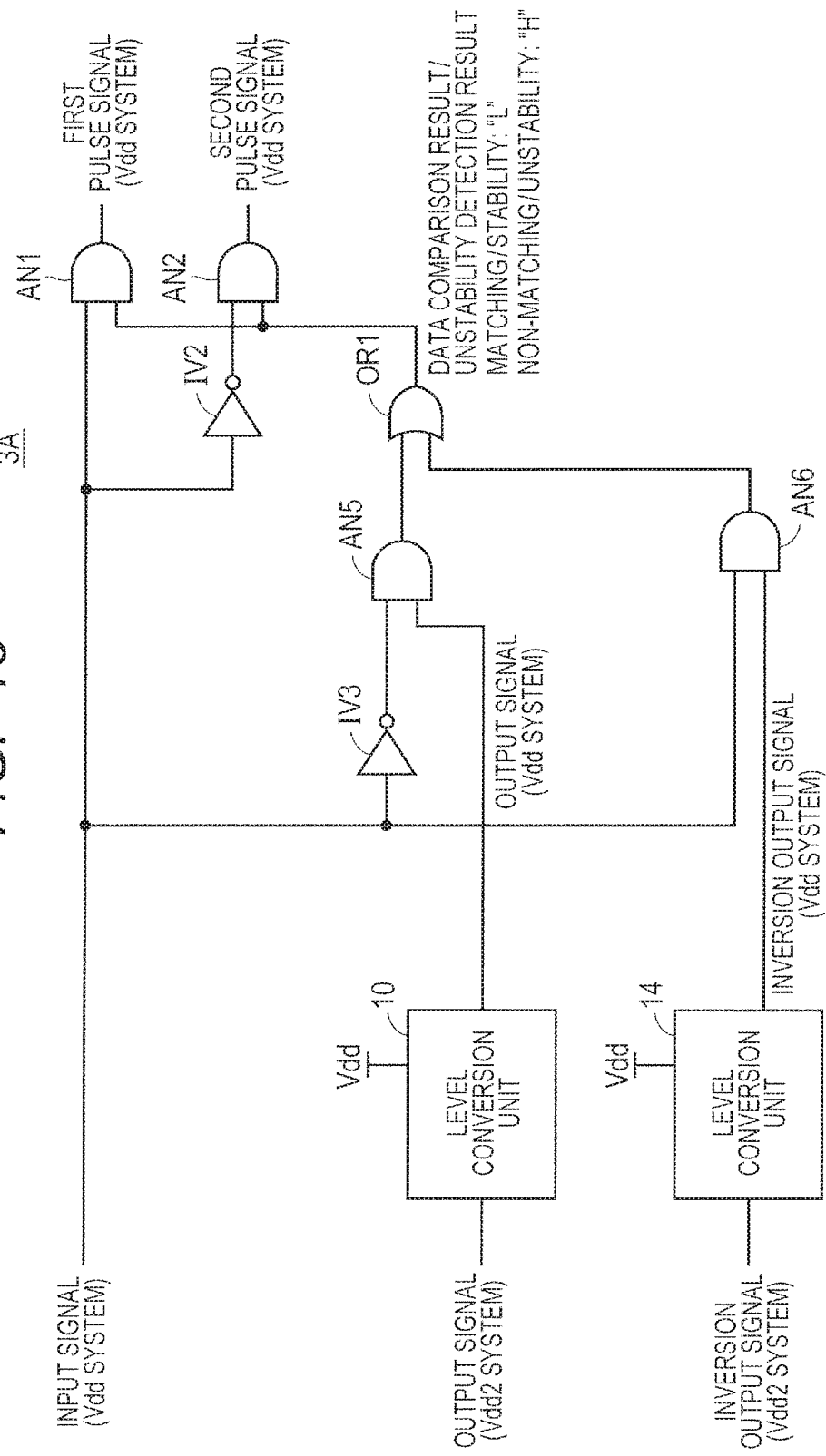
FIG. 15 is a diagram of assistance in explaining a pulse signal generation unit 3A according to a second modification of the second embodiment.

FIG. 15 is a diagram of assistance in explaining a pulse signal generation unit 3A according to a second modification of the second embodiment.

Referring to FIG. 15, the pulse signal generation unit 3A according to the second modification of the second embodiment is different from the pulse signal generation unit 3 in that the XOR gate 12 and the AND circuit AN4 are removed, and AND circuits AN5 and AN6 and an inverter IV3 are provided. Other configurations are the same as the pulse signal generation unit 3, and their detailed description is not repeated.

Each of the AND circuits AN5 and AN6 and the inverter IV3 includes a low withstand voltage transistor having a small area.

The AND circuit AN6 outputs the AND logical operation result of the input signal and the output signal of the level conversion unit 14 to the OR circuit OR1.

The AND circuit AN5 outputs the AND logical operation result of the inversion signal of the input signal through the inverter IV3 and the output signal of the level conversion unit 10 to the OR circuit OR1.

The OR circuit OR1 outputs the OR logical operation result of the output signal of the AND circuit AN5 and the output signal of the AND circuit AN6 to each of the AND circuits AN1 and AN2.

When the input signal rises from the "L" level to the "H" level, the output signal Q of the RS flip flop circuit 9 is at the "L" level in the initial state. The inversion output signal QB of the RS flip flop circuit 9 is at the "H" level in the initial state. The output signal Q and the inversion output signal QB are inputted through the feedback path to the pulse signal generation unit 3A.

Therefore, when the input signal rises from the "L" level to the "H" level, the AND circuit AN6 of the pulse signal generation unit 3A outputs the "H" level.

The OR circuit OR1 performs outputting to the AND circuits AN1 and AN2 according to the output signal of the AND circuit AN6. Since the OR circuit OR1 outputs the "H" level, the AND circuit AN1 outputs the first pulse signal at the "H" level.

The RS flip flop circuit 9 sets the output signal Q to the "H" level according to the set signal (the first pulse signal (the "H" level)). In addition, the RS flip flop circuit 9 sets the inversion output signal QB to the "L" level.

The output signal Q and the inversion output signal QB are inputted through the feedback path to the pulse signal generation unit 3A.

In the pulse signal generation unit 3A, both of the AND circuits AN5 and AN6 output the "L" level according to the inputs of the output signal Q (the "H" level) and the inversion output signal QB (the "L" level). The OR circuit OR1 outputs the "L" level to the AND circuits AN1 and AN2. The AND circuit AN1 sets the first pulse signal to the "L" level according to the input of the "L" level from the OR circuit OR1. Thus, the third pulse signal is also set to the "L" level.

According to this sequence of operation, the level conversion operation that converts the output signal from the "L" level to the "H" level at the time of the change of the input signal from the "L" level to the "H" level is completed.

When the input signal falls from the "H" level to the "L" level, the AND circuit AN5 of the pulse signal generation unit 3A outputs the "H" level based on the matching comparison result of the inversion signal of the input signal through the inverter IV3 and the output signal at the "H" level of the level conversion unit 10.

The OR circuit OR1 outputs the "H" level to the AND circuits AN1 and AN2 according to the output signal of the AND circuit AN5. Since the OR circuit OR1 outputs the H" level, the AND circuit AN2 outputs the second pulse signal at the "H" level.

The RS flip flop circuit 9 sets the output signal Q to the "L" level according to the reset signal (the fourth pulse signal (the "H" level)). In addition, the RS flip flop circuit 9 sets the inversion output signal QB to the "H" level.

In the pulse signal generation unit 3A, both of the AND circuits AN5 and AN6 output the "L" level according to the inputs of the output signal Q (the "L" level) and the inversion output signal QB (the "H" level). The OR circuit OR1 outputs the "L" level to the AND circuits AN1 and AN2. The AND circuit AN2 sets the second pulse signal to the "L" level according to the input of the "L" level from the OR circuit OR1. Thus, the fourth pulse signal is also set to the "L" level.

According to this sequence of operation, the level conversion operation that converts the output signal from the "H" level to the "L" level at the time of the change of the input signal from the "H" level to the "L" level is completed.

On the other hand, in the metastable state, the RS flip flop circuit 9 outputs the output signal Q and the inversion output signal QB, which are both at the "H" level.

In this case, the AND circuits AN5 and AN6 of the pulse signal generation unit 3A receive the input signal and the inversion signal of the input signal. Therefore, one of the AND circuits AN5 and AN6 outputs the output signal at the "H" level.

The OR circuit OR1 outputs the output signal at the "H" level to each of the AND circuits AN1 and AN2.

Therefore, in the case of the metastable state, the first pulse signal or the second pulse signal is generated.

Since the set signal or the reset signal is inputted to the RS flip flop circuit 9, the output signal of the RS flip flop circuit 9 is set again.

Thus, the metastable state can be eliminated.

With the configuration, in place of the XOR gate, the AND circuits and the inverter can configure the circuit, so that the number of components can be reduced to make the area smaller.

Third Modification of Second Embodiment

Figure 16:
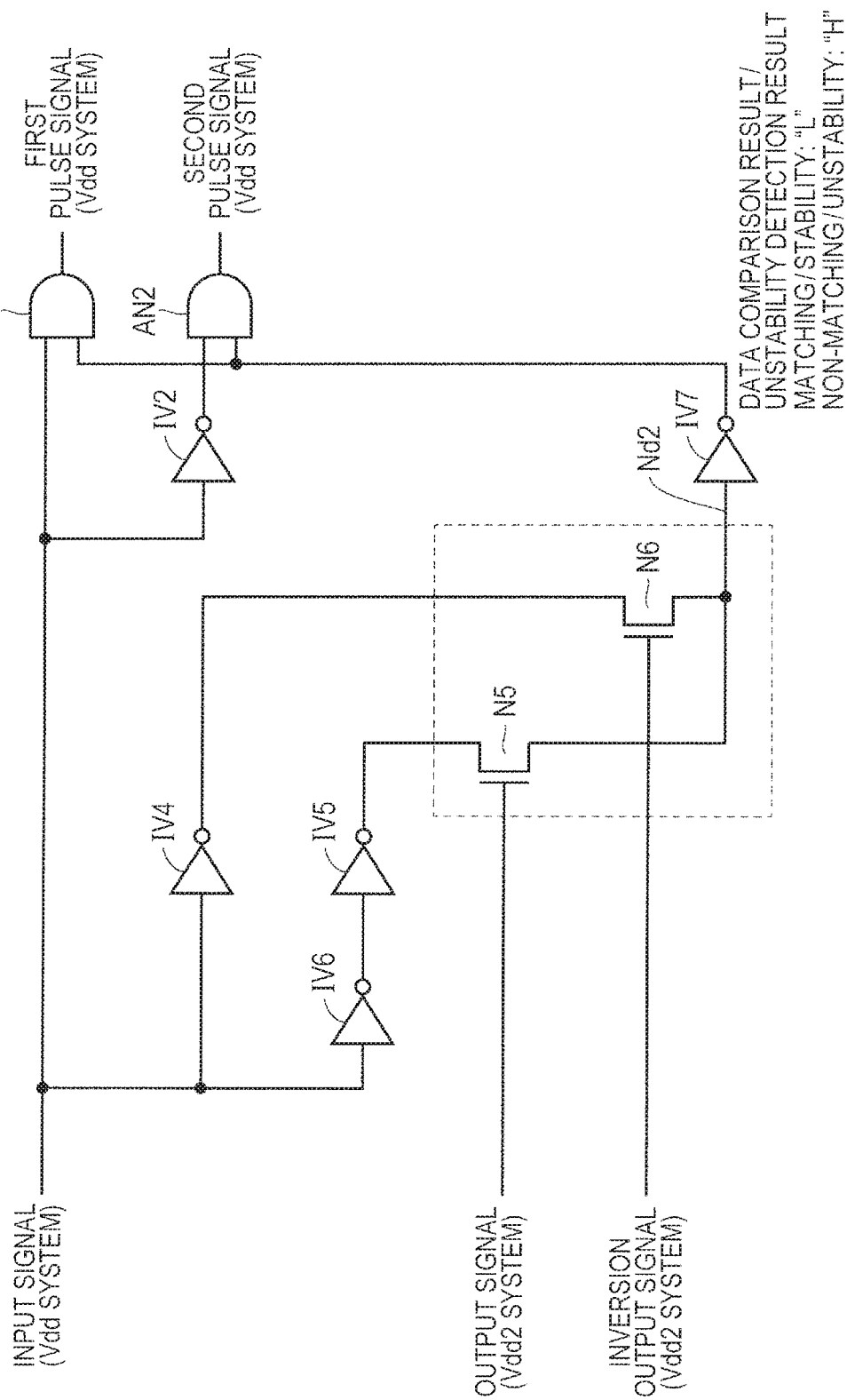
FIG. 16 is a diagram of assistance in explaining a pulse signal generation unit 3B according to a third modification of the second embodiment.

FIG. 16 is a diagram of assistance in explaining a pulse signal generation unit 3B according to a third modification of the second embodiment.

Referring to FIG. 16, the pulse signal generation unit 3B according to the third modification of the second embodiment is different from the pulse signal generation unit 3A in that the level conversion units 10 and 14, the AND circuits AN5 and AN6, the OR circuit OR1, and the inverter IV3 are removed, and inverters IV4 to IV7 and N-channel MOS transistors N5 and N6 are provided. Other configurations are the same as the pulse signal generation unit 3A, and their detailed description is not repeated.

Each of the inverters IV4 to IV7 includes a low withstand voltage transistor having a small area. Each of the N-channel MOS transistors N5 and N6 includes a high withstand voltage transistor.

The N-channel MOS transistor N5 has a source coupled to the inverter IV5, and a drain coupled to a node Nd2. The N-channel MOS transistor N5 has a gate receiving the output signal Q.

The N-channel MOS transistor N6 has a source coupled to the inverter IV4, and a drain coupled to the node Nd2. The N-channel MOS transistor N6 has a gate receiving the inversion output signal QB. The N-channel MOS transistor N5 and the N-channel MOS transistor N6 are parallel coupled to the node Nd2.

The inverter IV7 inverts the signal transmitted to the node Nd2 to output the inverted signal to each of the AND circuits AN1 and AN2.

The inverter IV6 inverts the input signal to output the inverted input signal to the inverter IV5.

The N-channel MOS transistors N5 and N6 function as selectors, each of which selects at least one of the output signal of the inverter IV4 and the output signal of the inverter IV5 to output the selected signal.

When the input signal rises from the "L" level to the "H" level, the output signal Q of the RS flip flop circuit 9 is at the "L" level in the initial state. In addition, the inversion output signal QB of the RS flip flop circuit 9 is at the "H" level in the initial state.

The output signal Q and the inversion output signal QB are inputted through the feedback path to the pulse signal generation unit 3B.

Therefore, the N-channel MOS transistor N5 of the pulse signal generation unit 3B is off, and the N-channel MOS transistor N6 is on.

Therefore, the output signal of the inverter IV4 is transmitted to the node Nd2. In this case, the output signal is set to the "L" level. With this, the inverter IV7 outputs the "H" level.

Since the inverter IV7 outputs the "H" level, the AND circuit AN1 outputs the first pulse signal at the "H" level.

The RS flip flop circuit 9 sets the output signal Q to the "H" level according to the set signal (the third pulse signal (the "H" level)). In addition, the RS flip flop circuit 9 sets the inversion output signal QB to the "L" level.

The output signal Q and the inversion output signal QB are inputted through the feedback path to the pulse signal generation unit 3B.

Then, the N-channel MOS transistor N5 of the pulse signal generation unit 3B is turned on, and the N-channel MOS transistor N6 is turned off.

Thus, the output signal (the "H" level) of the inverter IV5 is transmitted to the node Nd2. Therefore, the inverter IV7 outputs the "L" level. The AND circuit AN1 sets the first pulse signal to the "L" level according to the input of the "L" level from the inverter IV7. Thus, the third pulse signal is also set to the "L" level.

According to this sequence of operation, the level conversion operation that converts the output signal from the "L" level to the "H" level at the time of the change of the input signal from the "L" level to the "H" level is completed.

Next, when the input signal falls from the "H" level to the "L" level, the output signal of the inverter IV5 of the pulse signal generation unit 3B is transmitted to the node Nd2.

In this case, the node Nd2 is set to the "L" level. With this, the inverter IV7 outputs the "H" level.

Since the inverter IV7 outputs the "H" level, the AND circuit AN2 outputs the second pulse signal at the "H" level.

The RS flip flop circuit 9 sets the output signal Q to the "L" level according to the reset signal (the fourth pulse signal (the "H" level)).

The output signal Q and the inversion output signal QB are inputted through the feedback path to the pulse signal generation unit 3B.

Then, the N-channel MOS transistor N5 of the pulse signal generation unit 3B is turned off, and the N-channel MOS transistor N6 is turned on.

Thus, the output signal (the "H" level) of the inverter IV4 is transmitted to the node Nd2. Therefore, the inverter IV7 outputs the "L" level. The AND circuit AN2 sets the second pulse signal to the "L" level according to the input of the "L" level from the inverter IV7. Thus, the fourth pulse signal is also set to the "L" level.

According to this sequence of operation, the level conversion operation that converts the output signal from the "H" level to the "L" level at the time of the change of the input signal from the "H" level to the "L" level is completed.

On the other hand, in the metastable state, the RS flip flop circuit 9 outputs the output signal Q and the inversion output signal QB, which are both at the "H" level.

The output signal Q and the inversion output signal QB are inputted through the feedback path to the pulse signal generation unit 3B.

Then, the N-channel MOS transistor N5 of the pulse signal generation unit 3B is turned on, and the N-channel MOS transistor N6 is also turned on.

In this case, the inverters IV4 and IV5 of the pulse signal generation unit 3B output the inversion signal of the input signal and a signal having the same phase as the input signal, respectively. Therefore, one of the inverters IV4 and IV5 inevitably outputs the output signal at the "L" level. With this, the inverter IV7 outputs the "H" level.

In this respect, the driving ability of the N-channel MOS transistors for the inverters IV4 and IV5 is set to be higher than the driving ability of the P-channel MOS transistor.

In the case of the metastable state in which the N-channel MOS transistors N5 and N6 are turned on at the same time, the outputs of the inverters IV4 and IV5 collide with each other, but the driving ability of the N-channel MOS transistor having a high driving ability overcomes the collision, and as a result, the ground voltage Vss (the "L" level) is inputted to the inverter IV7, and the output signal at the "H" level is inputted to each of the AND circuits AN1 and AN2.

Therefore, in the case of the metastable state, the first pulse signal or the second pulse signal is generated.

Since the set signal or the reset signal is inputted to the RS flip flop circuit 9, the output signal of the RS flip flop circuit 9 is set again. Thus, the metastable state can be eliminated.

By the configuration, the pulse signal generation unit 3B removes the level conversion units 10 and 14, and includes the inverters and the N-channel MOS transistors, so that the number of components can be reduced to make the area smaller.

This disclosure has been specifically described above based on the embodiments, but this disclosure is not limited to the embodiments, and needless to say, various modifications can be made in the scope without departing from its purport.

What is claimed is:
1. A level shift circuit comprising:
a pulse signal generation unit that generates first and second pulse signals with respect to an input signal;
a first level conversion unit that converts the first pulse signal at a first voltage to a third pulse signal at a second voltage;
a second level conversion unit that converts the second pulse signal at the first voltage to a fourth pulse signal at the second voltage; and
a flip flop circuit that makes an output signal at the second voltage rise according to the third pulse signal and makes the output signal at the second voltage fall according to the fourth pulse signal,
wherein when the input signal rises, the pulse signal generation unit compares the input signal with the output signal of the flip flop circuit, and generates the first pulse signal based on a non-matching comparison result, and
wherein when the input signal falls, the pulse signal generation unit compares the input signal with the output signal of the flip flop circuit, and generates the second pulse signal based on the non-matching comparison result.
2. The level shift circuit according to claim 1,
wherein the pulse signal generation unit includes:
a third level conversion unit that converts the output signal at the second voltage to the first voltage;
a logical sum circuit that outputs the logical sum operation result of the input signal and the output signal from the third level conversion unit;
a first AND circuit that outputs, as the first pulse signal, the AND logical operation result of the input signal and the logical sum operation result; and
a second AND circuit that outputs, as the second pulse signal, the AND logical operation result of the inversion signal of the input signal and the logical sum operation result.
3. The level shift circuit according to claim 1,
wherein each of the first and second level conversion units includes:
a resistance element that is coupled between the second voltage and an internal node;
a first MOS transistor that is provided between the internal node and a third voltage and has a gate receiving the respective of the first pulse signal at the first voltage and the second pulse signal at the first voltage;
a second MOS transistor that is coupled between the second voltage and an output node and has a gate coupled to the internal node; and
a third MOS transistor that is coupled between the output node and the third voltage and has a gate coupled to the internal node.
4. The level shift circuit according to claim 1,
wherein each of the first and second level conversion units includes:
a first MOS transistor that is coupled between the second voltage and an internal node and has a gate coupled to the internal node;
a second MOS transistor that is coupled between the second voltage and an output node so as to form a current mirror circuit together with the first MOS transistor;
a third MOS transistor that is provided between the internal node and a third voltage and has a gate receiving the respective of the first pulse signal at the first voltage and the second pulse signal at the first voltage; and
a fourth MOS transistor that is coupled between the output node and the third voltage and has a gate receiving the respective of the inversion signal of the first pulse signal and the inversion signal of the second pulse signal.
5. The level shift circuit according to claim 1,
wherein the flip flop circuit includes a state detection circuit that compares an internal signal held according to the input of the third and fourth pulse signals with the output signal to output a state signal indicating the state of the internal signal at the second voltage,
wherein when the input signal rises, the pulse signal generation unit compares the input signal with the output signal of the flip flop circuit, and generates the first pulse signal based on a non-matching comparison result or the state signal, and
wherein when the input signal falls, the pulse signal generation unit compares the input signal with the output signal of the flip flop circuit, and generates the second pulse signal based on the non-matching comparison result or the state signal.
6. The level shift circuit according to claim 5,
wherein the state detection circuit further includes a latch circuit that holds the internal signal according to the inputs of the third and fourth pulse signals, and
wherein the logical threshold value of the latch circuit and the logical threshold value of the state detection circuit are different from each other.
7. The level shift circuit according to claim 5,
wherein the pulse signal generation unit includes:
a third level conversion unit that converts the output signal at the second voltage to the first voltage;
a fourth level conversion unit that converts the state signal at the second voltage to the first voltage;
a logical sum circuit that outputs the logical sum operation result of the input signal and the output signal from the third level conversion unit;
an OR circuit that outputs the OR logical operation result of the output signal of the logical sum circuit and the output signal of the fourth level conversion unit;
a first AND circuit that outputs, as the first pulse signal, the AND logical operation result of the input signal and the output signal of the OR circuit; and
a second AND circuit that outputs, as the second pulse signal, the AND logical operation result of the inversion signal of the input signal and the output signal of the OR circuit.
8. The level shift circuit according to claim 1,
wherein the pulse signal generation unit includes:
a third level conversion unit that converts the output signal at the second voltage to the first voltage;
a fourth level conversion unit that converts the inversion signal of the output signal at the second voltage to the first voltage;
a logical sum circuit that outputs the logical sum operation result of the input signal and the output signal from the third level conversion unit;
a first AND circuit that outputs the AND logical operation result of the output signal of the third level conversion unit and the inversion signal of the output signal of the fourth level conversion unit;

an OR circuit that outputs the OR logical operation result of the output signal of the first AND circuit and the output signal of the logical sum circuit;

a second AND circuit that outputs, as the first pulse signal, the AND logical operation result of the input signal and the output signal of the OR circuit; and a third AND circuit that outputs, as the second pulse signal, the AND logical operation result of the inversion signal of the input signal and the output signal of the OR circuit.

9. The level shift circuit according to claim 1, wherein the pulse signal generation unit includes:

a third level conversion unit that converts the output signal at the second voltage to the first voltage;

a fourth level conversion unit that converts the inversion signal of the output signal at the second voltage to the first voltage;

a first AND circuit that outputs the AND logical operation result of the inversion signal of the input signal and the output signal of the third level conversion unit;

a second AND circuit that outputs the AND logical operation result of the input signal and the inversion signal of the output signal of the fourth level conversion unit;

an OR circuit that outputs the OR logical operation result of the output signal of the first AND circuit and the output signal of the second AND circuit;

a third AND circuit that outputs, as the first pulse signal, the AND logical operation result of the input signal and the output signal of the OR circuit; and a fourth AND circuit that outputs, as the second pulse signal, the AND logical operation result of the inversion signal of the input signal and the output signal of the OR circuit.

10. The level shift circuit according to claim 1, wherein the pulse signal generation unit includes:

a selector that outputs one of the input signal and the inversion signal of the input signal according to the output signal;

a first AND circuit that outputs, as the first pulse signal, the AND logical operation result of the input signal and the inversion signal of the signal selected by the selector; and a second AND circuit that outputs, as the second pulse signal, the AND logical operation result of the input signal and the inversion signal of the signal selected by the selector.

11. The level shift circuit according to claim 10, wherein the selector includes:

a first switch that selects the input signal according to the input of the output signal; and a second switch that selects the inversion signal of the input signal according to the input signal of the inversion signal of the output signal.

12. The level shift circuit according to claim 11, wherein the pulse signal generation unit includes:

a first inverter that outputs the inversion signal of the input signal;

second and third inverters that are coupled in series to output a signal having the same phase as the input signal;

a first MOS transistor that has a source coupled to the second and third inverters, a gate receiving the input of the output signal, and a drain coupled to an output node; and a second MOS transistor that has a source coupled to the first inverter, a gate receiving the input of the inversion signal of the output signal, and a drain coupled to the output node.

13. The level shift circuit according to claim 12, wherein each of the first inverter, the second inverter, and the third inverter is configured of a CMOS inverter of a P-channel MOS transistor and an N-channel MOS transistor, and wherein the driving ability of the N-channel MOS transistor is set higher than the driving of the P-channel MOS transistor with respect to the input signal.

14. The level shift circuit according to claim 2, wherein the logical sum circuit corresponds to an exclusive logical sum circuit that outputs the exclusive logical sum operation result of the input signal and the output signal from the third level conversion unit.

* * * * *